United States Patent
Okada et al.

(10) Patent No.: US 10,818,566 B2
(45) Date of Patent: Oct. 27, 2020

(54) CIRCUIT MODULE

(71) Applicant: Murata Manufacturing Co., Ltd., Kyoto (JP)

(72) Inventors: Ken Okada, Kyoto (JP); Kazushige Sato, Kyoto (JP); Shingo Funakawa, Kyoto (JP); Katsuhiko Fujikawa, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/454,302

(22) Filed: Jun. 27, 2019

(65) Prior Publication Data
US 2019/0318973 A1    Oct. 17, 2019

Related U.S. Application Data

(63) Continuation of application No. PCT/JP2017/042218, filed on Nov. 24, 2017.

(30) Foreign Application Priority Data

Dec. 28, 2016   (JP) ................. 2016-254777

(51) Int. Cl.
*H01L 23/29* (2006.01)
*H01L 23/31* (2006.01)
(Continued)

(52) U.S. Cl.
CPC .......... *H01L 23/29* (2013.01); *H01L 23/3121* (2013.01); *H01L 23/36* (2013.01);
(Continued)

(58) Field of Classification Search
CPC ..... H01L 23/29; H01L 23/3121; H01L 23/36; H01L 23/49537; H01L 23/5389; H01L 25/105
(Continued)

(56) References Cited

U.S. PATENT DOCUMENTS

2008/0012119 A1* 1/2008 Otremba ................. H01L 21/78
257/698
2008/0185692 A1* 8/2008 Salzman ............... H01L 23/552
257/659
(Continued)

FOREIGN PATENT DOCUMENTS

JP    2001-243437 A    9/2001
JP    2003-115563 A    4/2003
(Continued)

OTHER PUBLICATIONS

International Search Report for International Application No. PCT/JP2017/042218, dated Feb. 6, 2018.
(Continued)

*Primary Examiner* — Sheikh Maruf
(74) *Attorney, Agent, or Firm* — Pearne & Gordon LLP

(57) ABSTRACT

A circuit module (101) includes a substrate (1) having a principal surface (1*a*), a first component (6) mounted on the principal surface (1*a*), and a sealing resin portion (3) that covers at least a side surface of the first component (6) while covering the principal surface (1*a*). The first component (6) includes an empty portion (6*c*) and a connection portion (6*b*) exposed to the empty portion (6*c*). The sealing resin portion (3) is arranged to avoid at least a part of a region that is included in an upper surface of the first component (6) and corresponds to the empty portion (6*c*).

6 Claims, 23 Drawing Sheets

(51) Int. Cl.
*H01L 23/36* (2006.01)
*H01L 23/495* (2006.01)
*H01L 23/538* (2006.01)
*H01L 25/10* (2006.01)
*H03H 9/25* (2006.01)
*H05K 1/02* (2006.01)

(52) U.S. Cl.
CPC .... *H01L 23/49537* (2013.01); *H01L 23/5389* (2013.01); *H01L 25/105* (2013.01); *H03H 9/25* (2013.01); *H05K 1/0204* (2013.01); *H05K 1/0209* (2013.01); *H05K 2201/10378* (2013.01); *H05K 2201/10621* (2013.01)

(58) Field of Classification Search
USPC .......................................................... 257/734
See application file for complete search history.

(56) References Cited

U.S. PATENT DOCUMENTS

| | | | | |
|---|---|---|---|---|
| 2011/0169118 A1* | 7/2011 | Sano | ................ | H01L 27/14618 257/432 |
| 2013/0062758 A1* | 3/2013 | Imoto | ................ | H01L 23/3135 257/737 |
| 2013/0069245 A1* | 3/2013 | Uchiyama | ............ | H01L 21/568 257/774 |
| 2013/0241048 A1* | 9/2013 | Lin | .................... | H01L 23/3107 257/734 |
| 2014/0167249 A1* | 6/2014 | Zhou | ................ | H01L 23/53295 257/734 |
| 2014/0239464 A1* | 8/2014 | Chung | ................... | H01L 23/60 257/659 |
| 2015/0008789 A1* | 1/2015 | Iwamoto | ................ | H03H 3/10 310/313 R |
| 2015/0035127 A1* | 2/2015 | Yang | ................ | H01L 23/49838 257/659 |
| 2015/0162319 A1* | 6/2015 | Scharf | .................... | H01L 25/18 257/659 |
| 2015/0214131 A1* | 7/2015 | Yonemochi | ............ | H01L 23/42 257/734 |
| 2015/0221578 A1* | 8/2015 | Mahler | ................ | H01L 21/565 257/734 |
| 2015/0235966 A1* | 8/2015 | Ohhashi | ................ | H01L 23/552 257/659 |
| 2015/0262941 A1* | 9/2015 | Steffen | ................ | H01L 21/565 257/690 |
| 2015/0351217 A1* | 12/2015 | Koukami | ............ | H05K 1/0209 361/707 |
| 2016/0005695 A1* | 1/2016 | Tai | ........................ | H01L 21/682 257/734 |
| 2016/0086894 A1* | 3/2016 | Rorane | ............ | H01L 23/49816 257/734 |
| 2016/0190399 A1* | 6/2016 | Abe | ....................... | H01L 33/502 257/99 |
| 2018/0242459 A1* | 8/2018 | Takeoka | ................... | H05K 3/28 |

FOREIGN PATENT DOCUMENTS

| | | | |
|---|---|---|---|
| JP | 2003115563 A | * | 4/2003 |
| JP | 2005-110017 A | | 4/2005 |
| JP | 2009-033333 A | | 2/2009 |
| JP | 2009033333 A | * | 2/2009 |
| JP | 2017-175427 A | | 9/2017 |
| WO | 2013/146374 A1 | | 10/2013 |
| WO | 2014/080931 A1 | | 5/2014 |

OTHER PUBLICATIONS

Written Opinion for International Application No. PCT/JP2017/042218, dated Feb. 6, 2018.

* cited by examiner

CIRCUIT MODULE

This is a continuation of International Application No. PCT/JP2017/042218 filed on Nov. 24, 2017 which claims priority from Japanese Patent Application No. 2016-254777 filed on Dec. 28, 2016. The contents of these applications are incorporated herein by reference in their entireties.

BACKGROUND OF THE DISCLOSURE

Field of the Disclosure

The present disclosure relates to circuit modules.

Description of the Related Art

Japanese Unexamined Patent Application Publication No. 2005-110017 (Patent Document 1) describes what is called a high-frequency filter module. The module described in Patent Document 1 includes a multilayer ceramic substrate and a thin film piezoelectric resonator mounted thereon. The thin film piezoelectric resonator is sealed with resin while including an empty portion. A vibrator of the thin film piezoelectric resonator is arranged to be exposed to the empty portion.

Patent Document 1: Japanese Unexamined Patent Application Publication No. 2005-110017

BRIEF SUMMARY OF THE DISCLOSURE

A circuit module may include an electronic component mounted on a substrate or the like, the electronic component may include an empty portion, and the electronic component may include a connection portion in a state of being exposed to the empty portion. Typically, an electronic component includes an electronic component body and a connection portion, and the electronic component body is electrically connected to a substrate or the like with the connection portion interposed therebetween. In this case, a fault such as a crack may be caused in the connection portion of the electronic component. The present inventors concluded that the cause of this fault is as below.

In solidification of resin performed so as to seal an electronic component with the resin, contraction of the resin may cause upward tensile stress against the electronic component. This tensile stress acts such that a connection portion exposed to an empty portion separates from the electronic component body or substrate. Further, if the expansion and contraction of the sealing resin that are accompanied by soldering, the heat generation and cooling of the electronic component body, the change in environmental temperature, and so on are repeated in this state, the tensile stress on the periphery of the connection portion varies repeatedly. In the end, a fault such as a crack may be caused in an interface surface between the connection portion and the electronic component body or substrate.

Thus, an object of the present disclosure is to provide a circuit module that can prevent the tensile stress due to the contraction of a sealing resin portion or the like from causing a fault such as a crack in a connection portion exposed to an empty portion.

To achieve the above-described object, a circuit module according to the present disclosure includes a substrate having a principal surface, a first component mounted on the principal surface, and a sealing resin portion that covers at least a side surface of the first component while covering the principal surface. The first component includes an empty portion and a connection portion exposed to the empty portion. The sealing resin portion is arranged to avoid at least a part of a region included in an upper surface of the first component and corresponding to the empty portion.

According to the present disclosure, a sealing resin portion is arranged to avoid at least a part of a region included in an upper surface of a first component and corresponding to an empty portion. Thus, the tensile stress due to the contraction of the sealing resin portion or the like can be prevented from causing a fault such as a crack in a connection portion of an electronic component, which is exposed to the empty portion.

DETAILED DESCRIPTION OF THE DISCLOSURE

Figure 1:
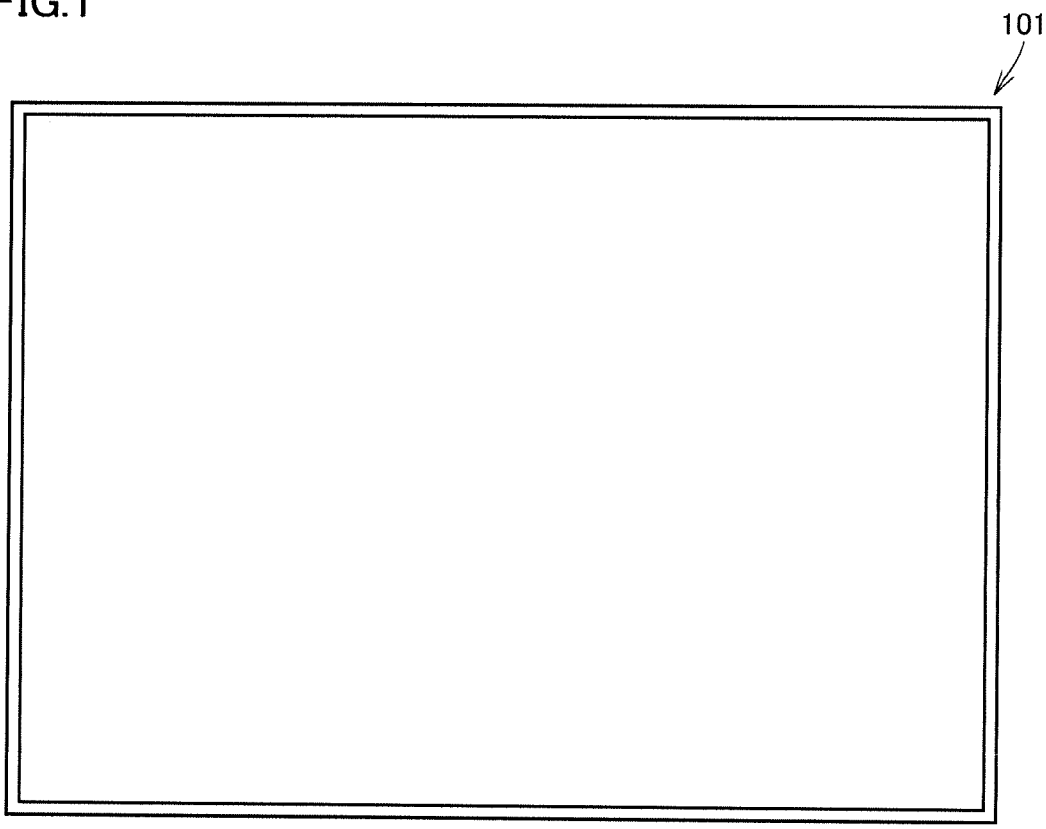
FIG. 1 is a plan view of a circuit module according to a first embodiment based on the present disclosure.

The ratios among the dimensions illustrated in the drawings may not necessarily indicate actual dimensional ratios faithfully but may indicate exaggerated dimensional ratios for convenience of explanation. In the description below, when concepts of higher (upper) or lower levels are mentioned, the mentioned concepts may not necessarily indicate absolute higher or lower levels but may indicate relative higher or lower levels in the illustrated positions.

First Embodiment

Figure 2:
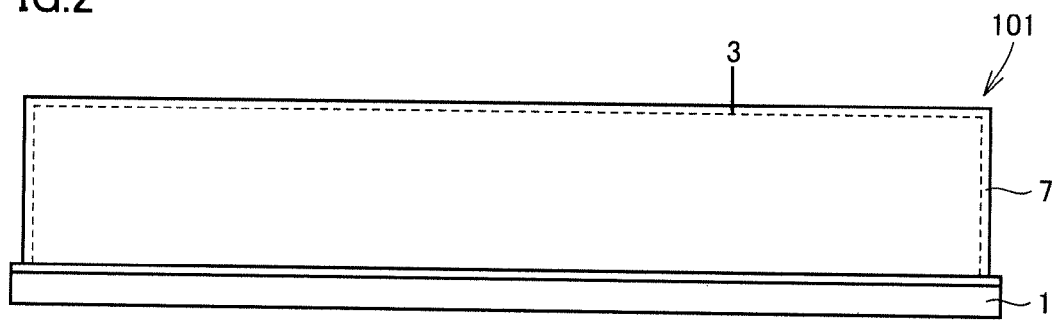
FIG. 2 is a side view of the circuit module according to the first embodiment based on the present disclosure.

Referring to FIGS. 1 to 4, a circuit module according to a first embodiment based on the present disclosure is described. FIG. 1 shows a plan view of the circuit module 101 according to the present embodiment. FIG. 2 shows a side view of the circuit module 101. The circuit module 101 includes a substrate 1, a sealing resin portion 3, and a conductor film 7. The conductor film 7 is a film formed as a shield for example. The conductor film 7 is a metal film for example.

Figure 3:
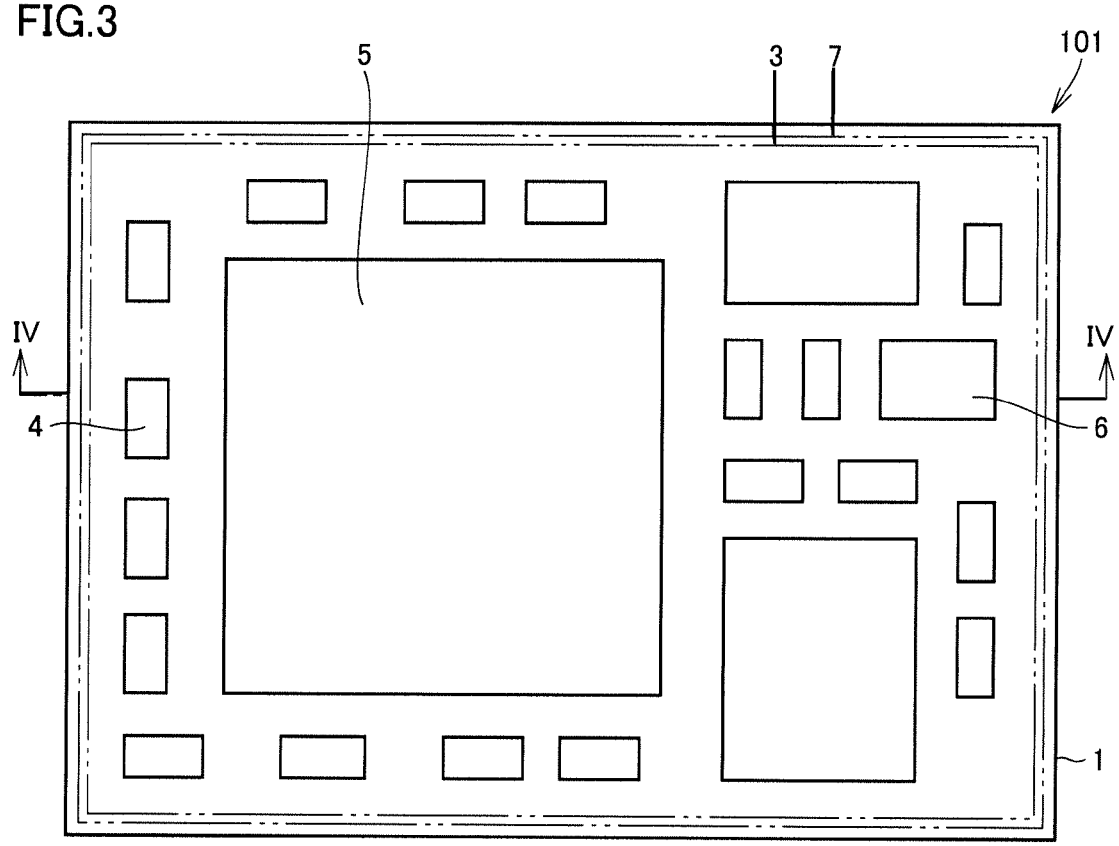
FIG. 3 is a perspective plan view of the circuit module according to the first embodiment based on the present disclosure.
Figure 4:
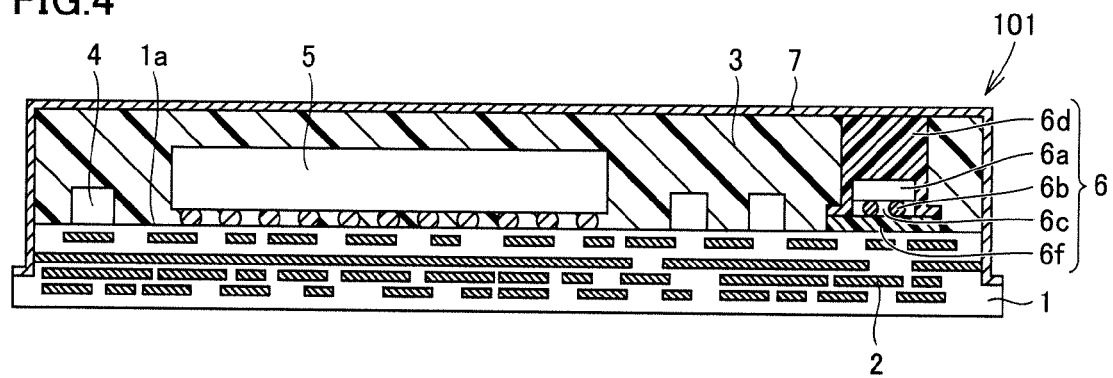
FIG. 4 is a cross-sectional view along line IV-IV indicated with the arrows in FIG. 3.

FIG. 3 shows a perspective plan view of the circuit module 101. The sealing resin portion 3 covers the components incorporated in the circuit module 101, and the like. FIG. 3 illustrates the internal structure of the sealing resin portion 3 in a perspective view for convenience of explanation. FIG. 4 shows a cross-sectional view along line IV-IV indicated with the arrows in FIG. 3. As illustrated in FIGS. 3 and 4, a first component 6 is arranged on a principal surface 1a of the substrate 1 in addition to components 4 and 5. The component 5 may be a transceiver IC for example. The component 4 may be, for example, one of a filter, a quartz vibrator, an LCR element, and the like. The first component 6 is a component that has a hollow package structure. The first component 6 may be, for example, one of a surface acoustic wave (SAW) filter, a bulk elastic wave (BAW) filter, a quartz vibrator, a MEMS switch, and the like.

In the present embodiment, the first component 6 includes a component body 6a, a connection portion 6b, a first resin portion 6d, and an interposer 6f. In the example presented here, the connection portion 6b is arranged under the component body 6a. The interposer 6f is arranged to lie on the principal surface 1a. The connection portion 6b electrically connects the component body 6a with the interposer 6f. In the example presented here, the first resin portion 6d is arranged over the component body 6a.

The circuit module 101 according to the present embodiment includes the substrate 1 having the principal surface 1a, the first component 6 mounted on the principal surface 1a, and the sealing resin portion 3 that covers at least a side surface of the first component 6 while covering the principal surface 1a. The first component 6 includes an empty portion 6c. The first component 6 includes the connection portion 6b, which is exposed to the empty portion 6c. The sealing resin portion 3 is arranged to avoid at least a part of the region that is included in the upper surface of the first component 6 and corresponds to the empty portion 6c. In the present embodiment, as illustrated in FIG. 4, the upper surface of the first component 6 is not covered by the sealing resin portion 3. The conductor film 7 is formed so as to cover the upper surface of the first component 6 and the upper surface of the sealing resin portion 3 collectively.

In the present embodiment, the first resin portion 6d covers the upper surface and side surface of the component body 6a collectively. However, the first resin portion 6d is not limited to this structure. For example, in a structure where the component body 6a is covered with certain lamination resin, the lamination resin may be further covered with epoxy resin. In this case, the epoxy resin portion that covers the top of the lamination resin corresponds to the first resin portion 6d.

For the first resin portion 6d of the first component 6, it is preferable to use a material with a small contraction factor so as to prevent the occurrence of the tensile stress against the connection portion 6b during the solidification as much as possible. When the first resin portion 6d is formed using epoxy resin for example, the conditions for the epoxy resin are desirably selected so that the contraction factor can be small to prevent the occurrence of the tensile stress against the connection portion 6b during the solidification as much as possible. When adjustment is attempted so as to decrease the contraction factor in the epoxy resin, this epoxy resin often has a large filling volume of the filler and a high consistency, such as silica ($SiO_2$). Such a material is unsuitable as the resin for forming the sealing resin portion 3. Thus, even if an identical epoxy resin is employed, it is preferable that the conditions for that used for the first resin portion 6d and that used for the sealing resin portion 3 be different.

For example, a material with a filling factor of the filler being approximately 91% is used for the first resin portion 6d of the first component 6 and a material with a filling factor of the filler being approximately 87% is used for the sealing resin portion 3.

In the present embodiment, the sealing resin portion 3 is arranged to avoid at least a part of the region that is included in the upper surface of the first component 6 and corresponds to the empty portion 6c. Accordingly, the magnitude of upward force exerted on the first component 6 due to contraction of the sealing resin portion 3 or the like can be decreased. Thus, tensile stress due to the contraction of the sealing resin portion 3 or the like can be prevented from causing a fault such as a crack in the connection portion 6b of the electronic component exposed to the empty portion 6c.

Although the present embodiment describes that "the sealing resin portion 3 avoids at least a part of the region that is included in the upper surface of the first component 6 and corresponds to the empty portion 6c," as a matter of course, the structure where "the sealing resin portion 3 avoids the entire region that is included in the upper surface of the first component 6 and corresponds to the empty portion 6c" may also be employed. Avoiding the entire region that is included in the upper surface of the first component 6 and corresponds to the empty portion 6c as described above can prevent a fault such as a crack caused by the tensile stress due to the contraction of the sealing resin portion 3 or the like with higher reliability.

Although the connection portion 6b is herein in contact with the principal surface 1a of the substrate 1 with the interposer 6f interposed therebetween, this is a mere example and not limiting. For example, the interposer 6f may be omitted in the structure. The connection portion 6b may be in direct contact with the principal surface 1a of the substrate 1.

In the present embodiment, the first component 6 includes the interposer 6f and thus, the empty portion 6c constitutes a completely closed space while being surrounded by the interposer 6f, the first resin portion 6d, and the component body 6a. Accordingly, the empty portion 6c is defined as a closed space even when the first component 6 is removed solely. However, the empty portion 6c is not necessarily a space ensured as a completely closed space when the first component 6 is removed solely. The empty portion 6c may be a mere depressed portion when the first component 6 is removed solely, and may be a closed space only when the first component 6 is mounted on the principal surface 1a or the like.

In the present embodiment, it is preferable that the first component 6 include the first resin portion 6d made of resin at a higher level than the empty portion 6c and that the upper surface of the first resin portion 6d and the upper surface of the sealing resin portion 3 be in an identical plane. Employing such a structure enables the upper surface of the circuit module to be flat.

The advantages described in the present embodiment can be obtained even if the upper surface of the first resin portion 6d is positioned higher than the upper surface of the sealing resin portion 3. Such a structure may be employed under the circumstances where the upper end of the first resin portion 6d is allowed to project from the upper surface of the sealing resin portion 3.

As presented in the present embodiment, it is preferable that the conductor film 7 be arranged to cover at least a boundary between the upper surface of the first component 6 and the upper surface of the sealing resin portion 3. Employing such a structure makes it possible to prevent the entry of water from the boundary between the first component 6 and the sealing resin portion 3, or the like.

Referring to FIGS. 5 to 10, a method for manufacturing the circuit module according to the first embodiment based on the present disclosure is described.

Figure 5:
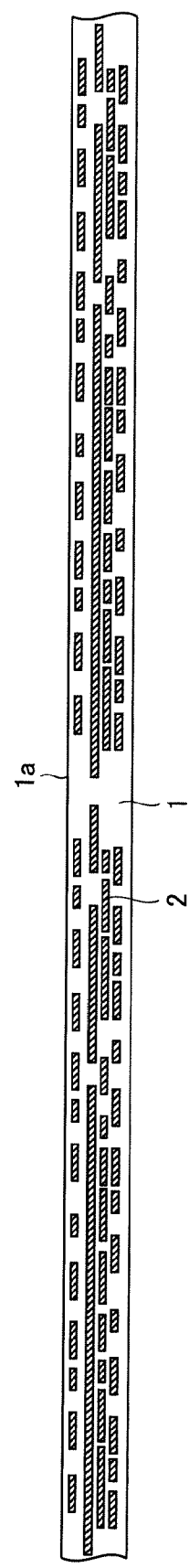
FIG. 5 is a first explanatory diagram for a method for manufacturing the circuit module according to the first embodiment based on the present disclosure.
Figure 6:
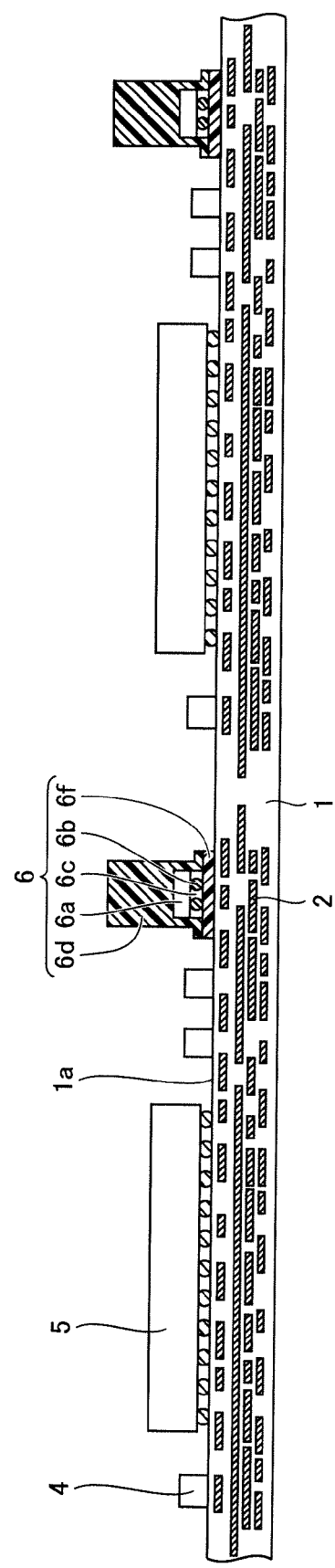
FIG. 6 is a second explanatory diagram for the method for manufacturing the circuit module according to the first embodiment based on the present disclosure.

First, as illustrated in FIG. 5, the substrate 1 having the principal surface 1a is prepared. The substrate 1 may be a wiring board. The substrate 1 may include a conductor pattern 2 inside. As illustrated in FIG. 6, the components 4 and 5, and the first component 6 are mounted over the principal surface 1a. In the present embodiment, it is preferable to use the first component 6 which is tall before mounting. The height of the overall first component 6 can be adjusted by, in the first component 6, causing the first resin portion 6d at a higher level than the component body 6a to have a large thickness. If the typical thickness of the epoxy resin layer as the first resin portion 6d of the first component 6 is approximately 0.1 mm and the typical height of the overall first component 6 is approximately 0.4 mm, it is conceivable that, in the present embodiment, the thickness of the epoxy resin layer as the first resin portion 6d is 0.4 mm and the height of the overall first component 6 is 0.7 mm. These are mere examples though.

Figure 7:
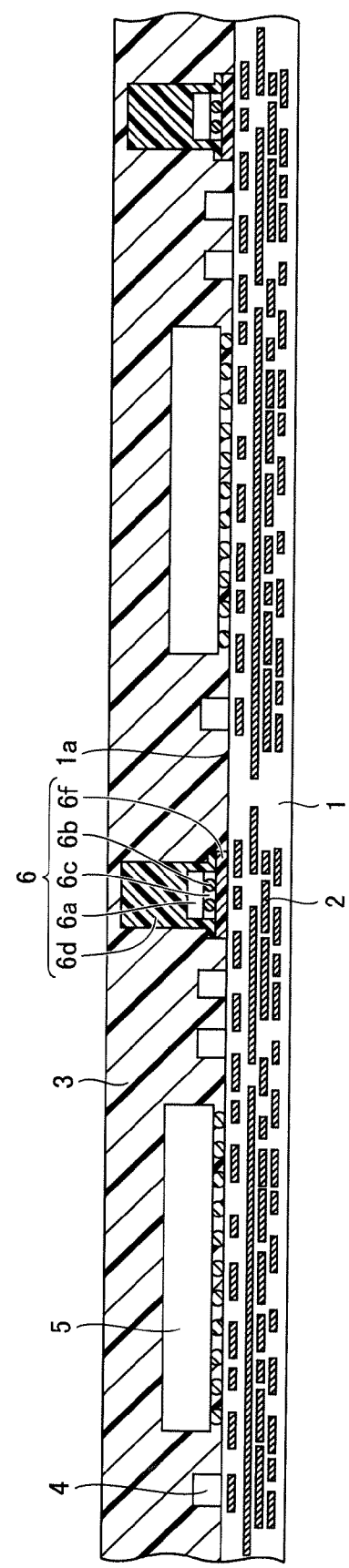
FIG. 7 is a third explanatory diagram for the method for manufacturing the circuit module according to the first embodiment based on the present disclosure.

As illustrated in FIG. 7, the sealing resin portion 3 is formed. The sealing resin portion 3 is formed to cover the components 4 and 5, and the first component 6. At this time, the sealing resin portion 3 may also cover the upper surface of the first component 6. The sealing resin portion 3 is formed so that the sealing resin portion 3 covers the component that is included in the components except the first component 6 and has the greatest height from the principal surface 1a.

Figure 8:
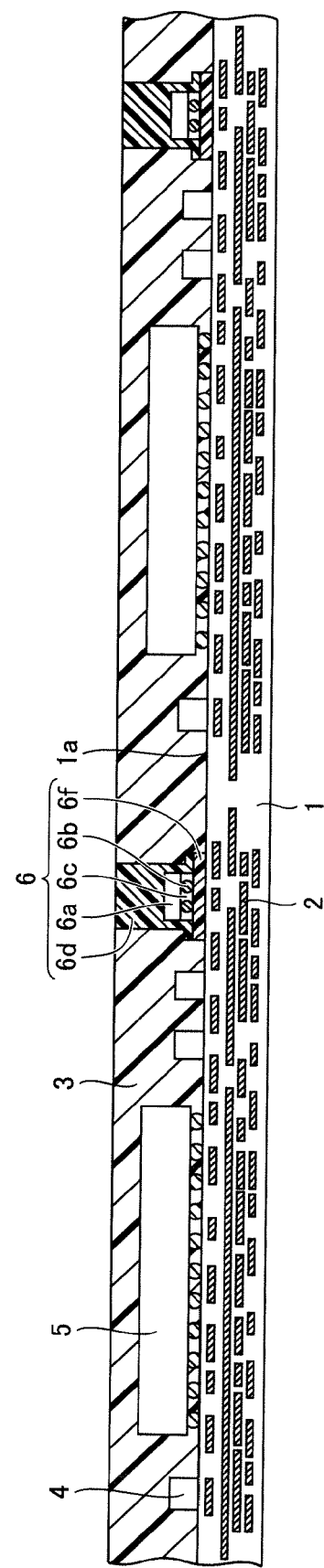
FIG. 8 is a fourth explanatory diagram for the method for manufacturing the circuit module according to the first embodiment based on the present disclosure.

As illustrated in FIG. 8, grinding is performed on the upper surface of the sealing resin portion 3 so as to expose the upper surface of the first component 6. In exposing the upper surface of the first component 6, an upper end portion of the first component 6 may be scraped. As a result, as illustrated in FIG. 8, the upper surface of the sealing resin portion 3 and the upper surface of the first component 6 may be positioned in an identical plane. In the present embodiment, if the height of the component that is included in the components mounted over the principal surface 1a, except the first component 6, and has the greatest height from the principal surface 1a is 0.5 mm, the grinding is performed so that the sealing resin portion 3 covers the top of this component with the height of 0.5 mm while having only a remaining thickness of 0.1 mm. In the grinding, the epoxy resin layer as the first resin portion 6d of the first component 6 is also ground such that the height of the first component 6 is 0.6 mm. Since the sealing resin portion 3 and the first component 6 are ground at the same time, the upper surface of the circuit module is made flat.

Figure 9:
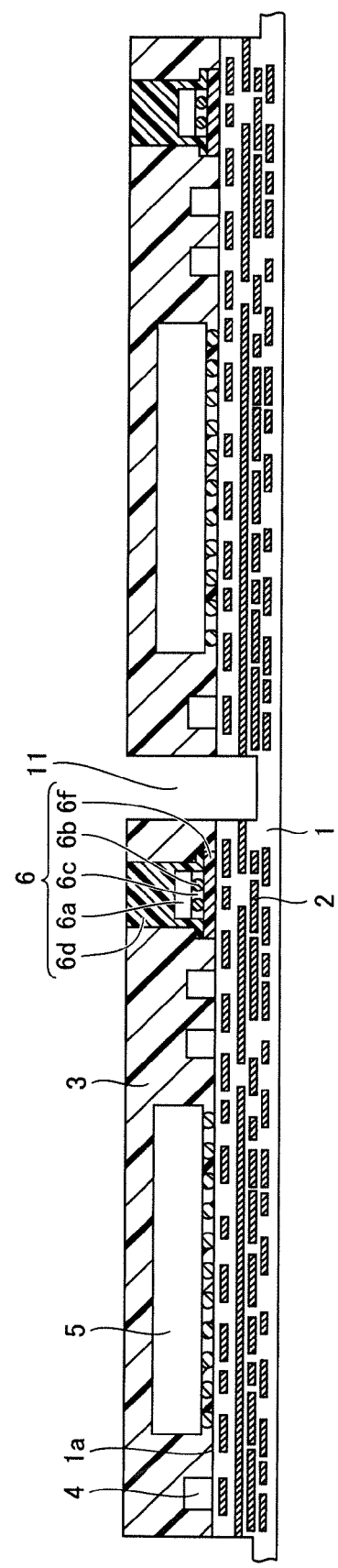
FIG. 9 is a fifth explanatory diagram for the method for manufacturing the circuit module according to the first embodiment based on the present disclosure.

As illustrated in FIG. 9, so-called half-cutting is performed. The half-cutting is to cut a substrate or the like to an intermediate portion in its thickness direction without cutting it completely. In the example illustrated in FIG. 9, the sealing resin portion 3 is completely cut apart and the substrate 1 is cut to an intermediate portion thereof. Thus, a groove 11 is formed.

Figure 10:
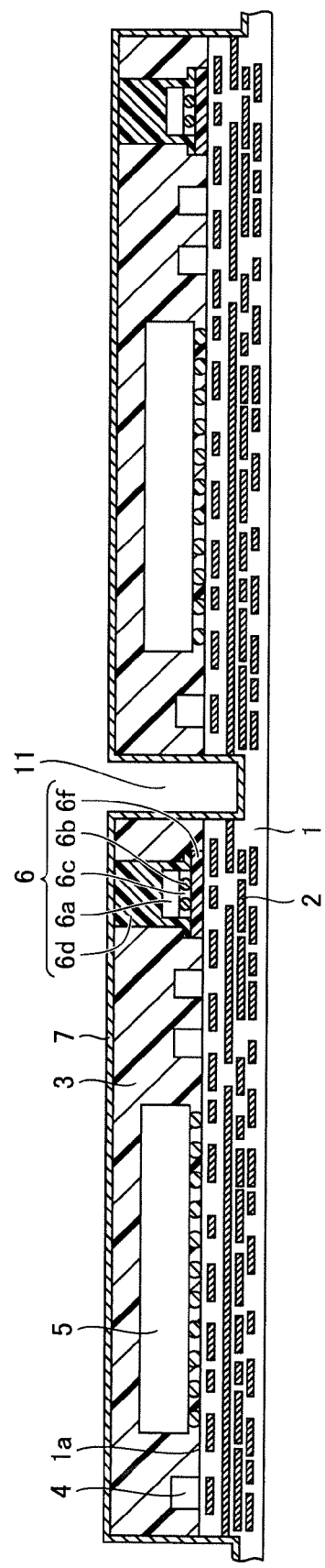
FIG. 10 is a sixth explanatory diagram for the method for manufacturing the circuit module according to the first embodiment based on the present disclosure.

As illustrated in FIG. 10, the conductor film 7 is formed. The conductor film 7 can be formed by a known technique. The conductor film 7 may be formed by coating. The conductor film 7 is formed by, for example, applying silver paste and then solidifying the applied silver paste. The conductor film 7 is formed so as to cover the upper surface of the first component 6 and the upper surface of the sealing resin portion 3 collectively. The conductor film 7 also covers the inner surface of the groove 11. In the present embodiment, the conductor film 7 is formed in the half-cut state and accordingly, the silver paste before the solidification can be prevented from exuding to the lower surface of the circuit module.

From the state illustrated in FIG. 10, the division is performed to achieve an individual size of the circuit module 101. It is here desired to divide the substrate 1 along the groove 11 already formed. Thus, the circuit module 101 illustrated in FIG. 4 can be obtained.

Second Embodiment

Figure 11:
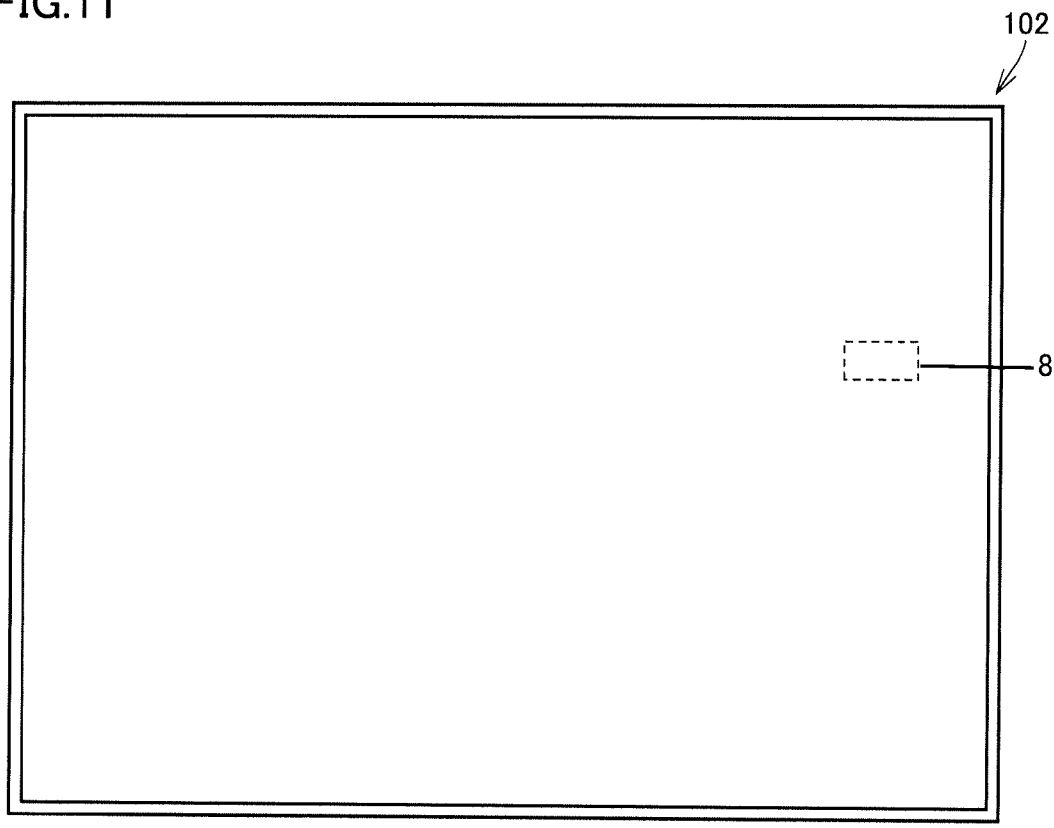
FIG. 11 is a plan view of a circuit module according to a second embodiment based on the present disclosure.
Figure 12:
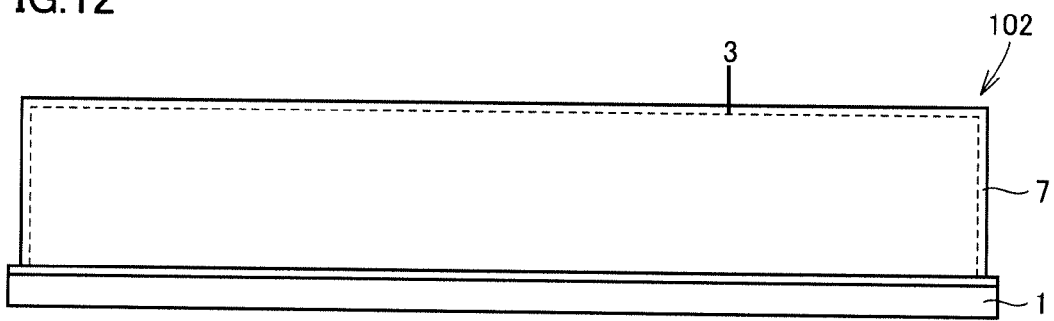
FIG. 12 is a side view of the circuit module according to the second embodiment based on the present disclosure.
Figure 13:
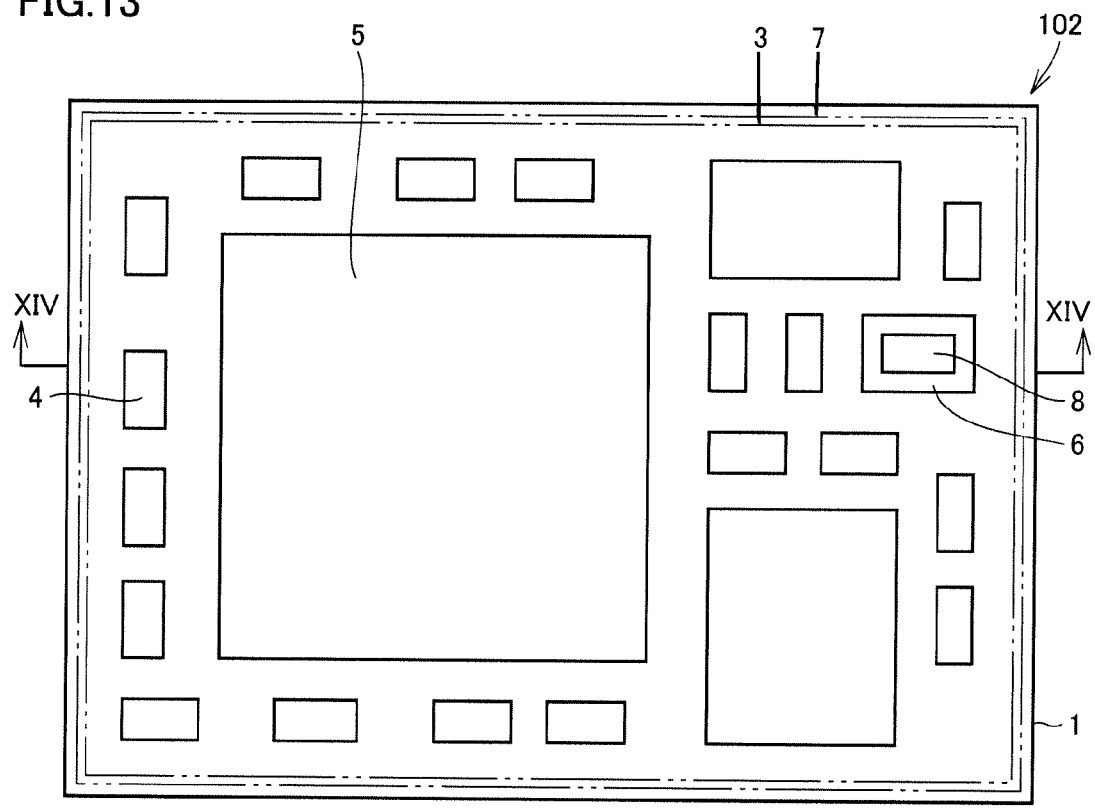
FIG. 13 is a perspective plan view of the circuit module according to the second embodiment based on the present disclosure.
Figure 14:
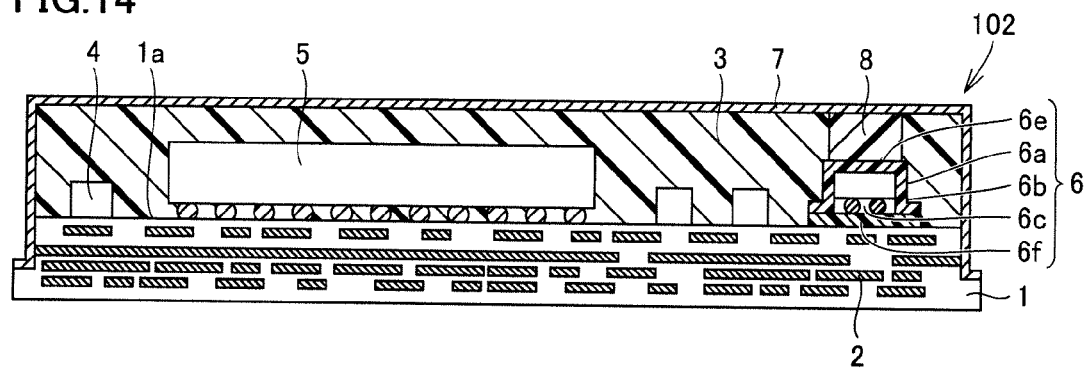
FIG. 14 is a cross-sectional view along line XIV-XIV indicated with the arrows in FIG. 13.

Referring to FIGS. 11 to 14, a circuit module according to a second embodiment based on the present disclosure is described. FIG. 11 shows a plan view of the circuit module 102 according to the present embodiment. FIG. 12 shows a side view of the circuit module 102. FIG. 13 shows a perspective plan view of the circuit module 102. FIG. 14 shows a cross-sectional view along line XIV-XIV indicated with the arrows in FIG. 13. The basic structure of the circuit module 102 is similar to that of the circuit module 101 described in the first embodiment. The circuit module 102 is different from the circuit module 101 described in the first embodiment on the following points.

In the circuit module 102, the upper surface of a first component 6 is positioned lower than the upper surface of a sealing resin portion 3, and a second resin portion 8 that is made of resin having a lower Young's modulus than that of the material for the sealing resin portion 3 is arranged over the first component 6. In the example presented here, the second resin portion 8 is mounted on the upper surface of the first component 6. The upper surface of the second resin portion 8 and the upper surface of the sealing resin portion 3 are in an identical plane.

In the circuit module 102, the first component 6 includes a resin portion 6e, which covers the upper surface and side surface of a component body 6a. The resin portion 6e may be, for example, epoxy resin with a thickness of 0.1 mm. The second resin portion 8 may be formed of silicone resin for example.

The present embodiment can bring the advantages described in the first embodiment. In addition, the second resin portion 8 that is made of resin having a lower Young's modulus than the material for the sealing resin portion 3 is arranged over the first component 6. Thus, the stress accompanied by the contraction of the resin of the sealing resin portion 3 can be easily absorbed by the second resin portion 8 with almost no influence on the upper surface of the first component 6. Accordingly, no excessive force acts on a connection portion 6b of the first component 6. Thus, the occurrence of a fault such as a crack in the connection portion 6b can be prevented. Particularly, in the present embodiment, a structure where the second resin portion 8 is mounted on the upper surface of the first component 6 is employed and the height is adjustable with the second resin portion 8. Thus, the one having a height as usual can be used as the first component 6.

As presented in the present embodiment, it is preferable that the conductor film 7 be arranged to cover at least a boundary between the upper surface of the second component 8 and the upper surface of the sealing resin portion 3. Employing such a structure makes it possible to prevent the entry of water from the boundary between the second component 8 and the sealing resin portion 3, or the like.

Referring to FIGS. 5, 15 to 20, and 14, a method for manufacturing the circuit module according to the second embodiment based on the present disclosure is described.

First, as illustrated in FIG. 5, the substrate 1 having a principal surface 1a is prepared. Until here, the process remains the same as that described in the first embodiment.

Figure 15:
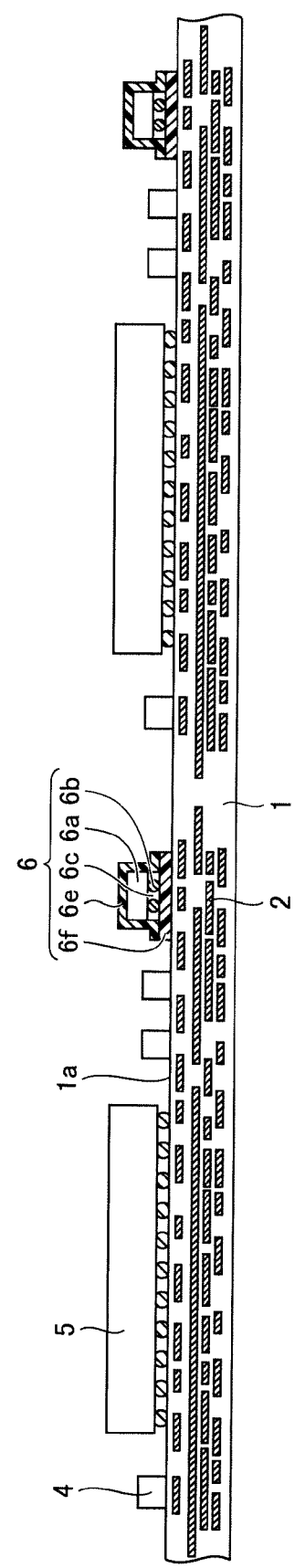
FIG. 15 is a first explanatory diagram for a method for manufacturing the circuit module according to the second embodiment based on the present disclosure.

As illustrated in FIG. 15, components 4 and 5, and the first component 6 are mounted over the principal surface 1a. In the present embodiment, the first component 6 needs not to be high. The first component 6 may include epoxy resin with a thickness of 0.1 mm as the resin portion 6e.

Figure 16:
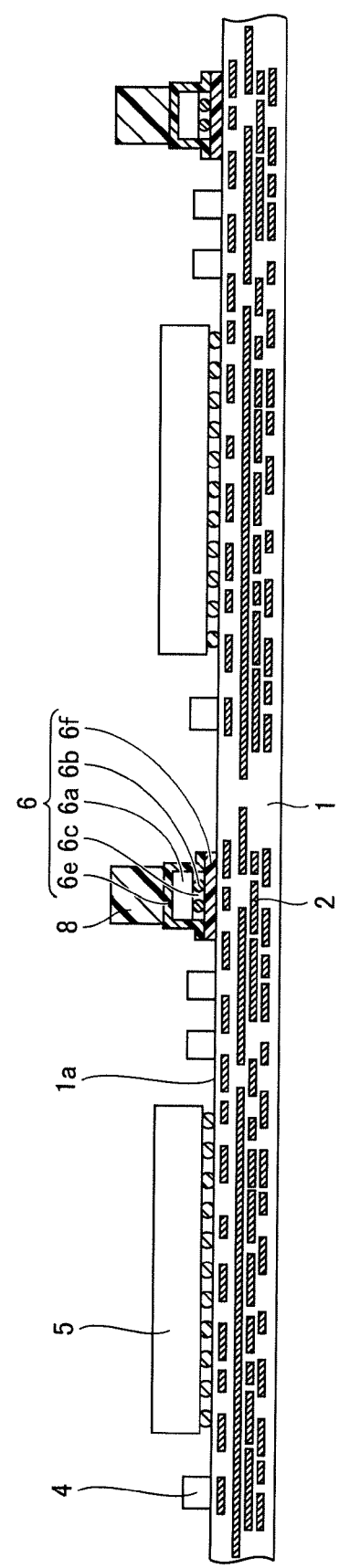
FIG. 16 is a second explanatory diagram for the method for manufacturing the circuit module according to the second embodiment based on the present disclosure.

As illustrated in FIG. 16, potting is performed with silicone resin on the first component 6. The silicone resin is preferably selected from what is solidified between an ordinary temperature and approximately 100° C. and is not degraded at approximately 300° C., which is a soldering temperature for a device substrate where the circuit module is mounted. The silicone resin portion coated on the first component 6 by the potting becomes the second resin portion 8 later. Although illustrated as a rectangle in FIG. 16 or the like, in actuality, the second resin portion 8 is not limited to such a rectangle and has a shape projecting upward because of the coating by the potting. The second resin portion 8 may have a domical shape for example.

Figure 17:
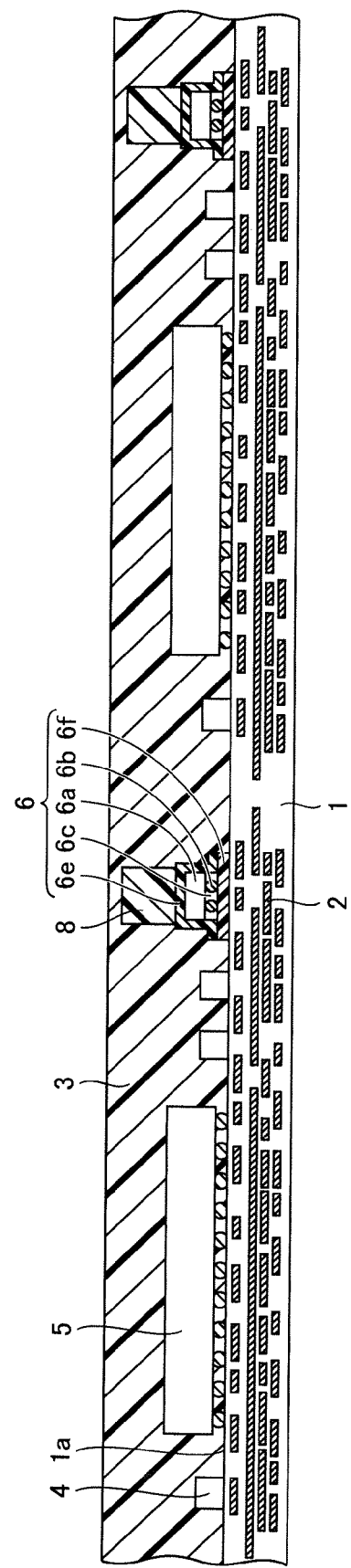
FIG. 17 is a third explanatory diagram for the method for manufacturing the circuit module according to the second embodiment based on the present disclosure.

As illustrated in FIG. 17, the sealing resin portion 3 is formed. The sealing resin portion 3 is formed to cover at least the components 4 and 5, and the first component 6. At this time, the sealing resin portion 3 may also cover the upper surface of the second resin portion 8.

Figure 18:
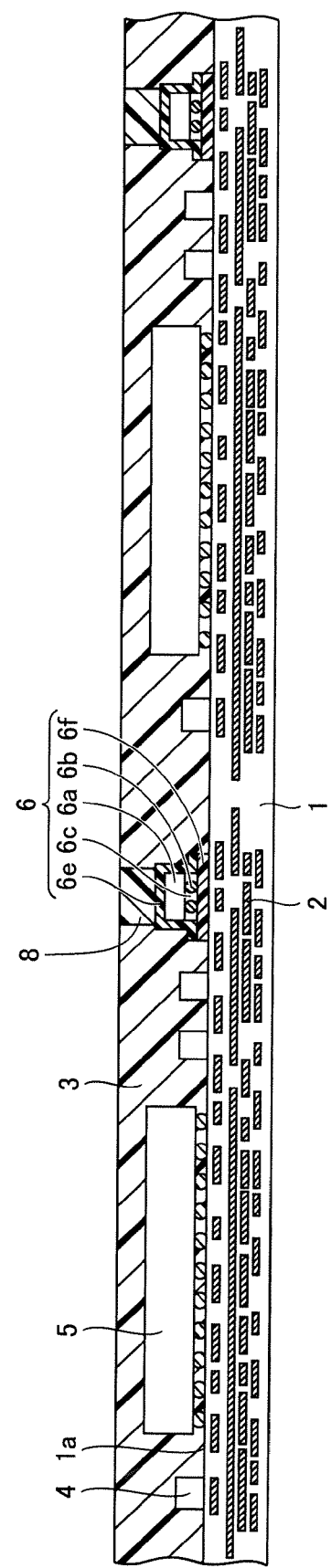
FIG. 18 is a fourth explanatory diagram for the method for manufacturing the circuit module according to the second embodiment based on the present disclosure.

As illustrated in FIG. 18, grinding is performed on the upper surface of the sealing resin portion 3 so as to expose the upper surface of the second resin portion 8. In exposing the upper surface of the second resin portion 8, an upper end portion of the second resin portion 8 may be scraped. As a result, as illustrated in FIG. 18, the upper surface of the sealing resin portion 3 and the upper surface of the second resin portion 8 may be positioned in an identical plane.

Figure 19:
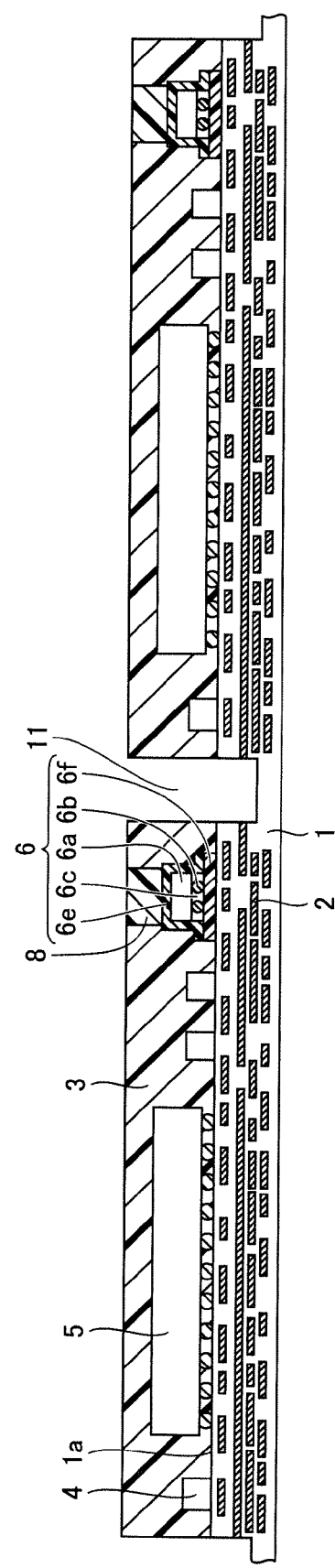
FIG. 19 is a fifth explanatory diagram for the method for manufacturing the circuit module according to the second embodiment based on the present disclosure.

As illustrated in FIG. 19, so-called half-cutting is performed. Thus, a groove 11 is formed.

Figure 20:
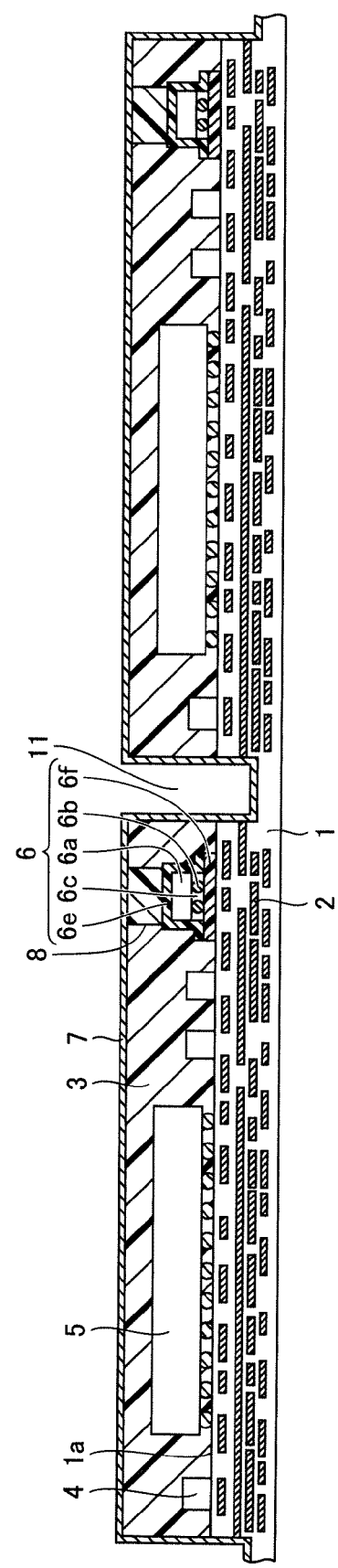
FIG. 20 is a sixth explanatory diagram for the method for manufacturing the circuit module according to the second embodiment based on the present disclosure.

As illustrated in FIG. 20, a conductor film 7 is formed. The conductor film 7 is formed so as to cover the upper surface of the second resin portion 8 and the upper surface of the sealing resin portion 3 collectively. From the state illustrated in FIG. 20, the division is performed to achieve an individual size of the circuit module 102. It is here desired to divide the substrate 1 along the groove 11 already formed. Thus, the circuit module 102 illustrated in FIG. 14 can be obtained.

Third Embodiment

Figure 21:
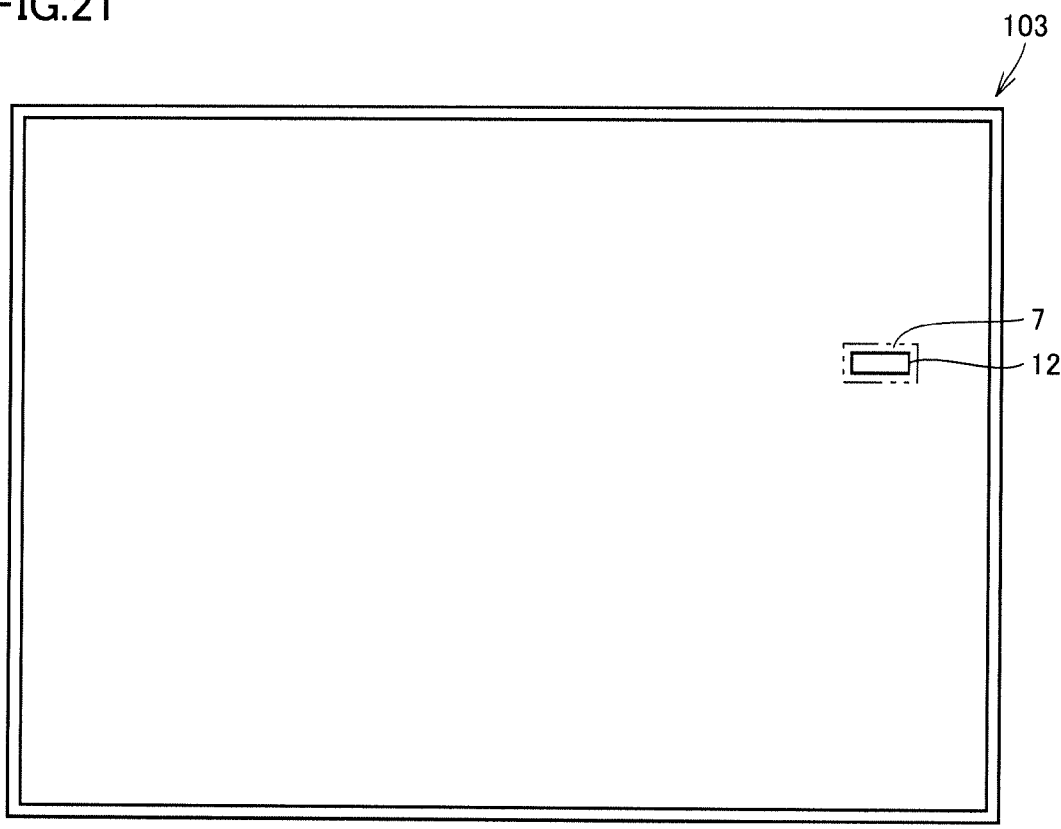
FIG. 21 is a plan view of a circuit module according to a third embodiment based on the present disclosure.
Figure 22:
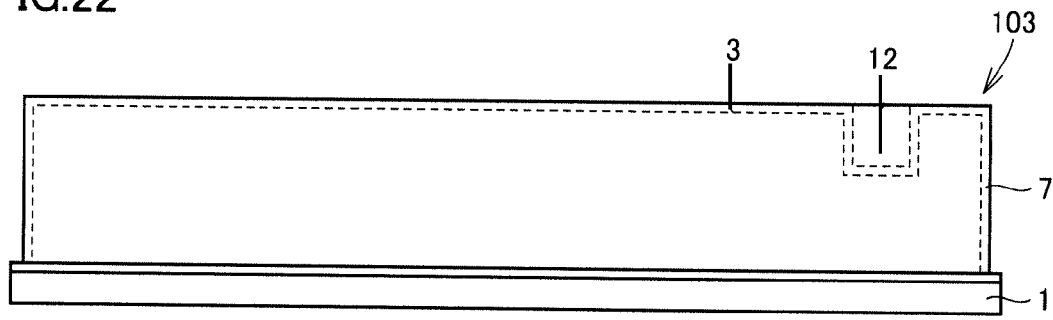
FIG. 22 is a side view of the circuit module according to the third embodiment based on the present disclosure.
Figure 23:
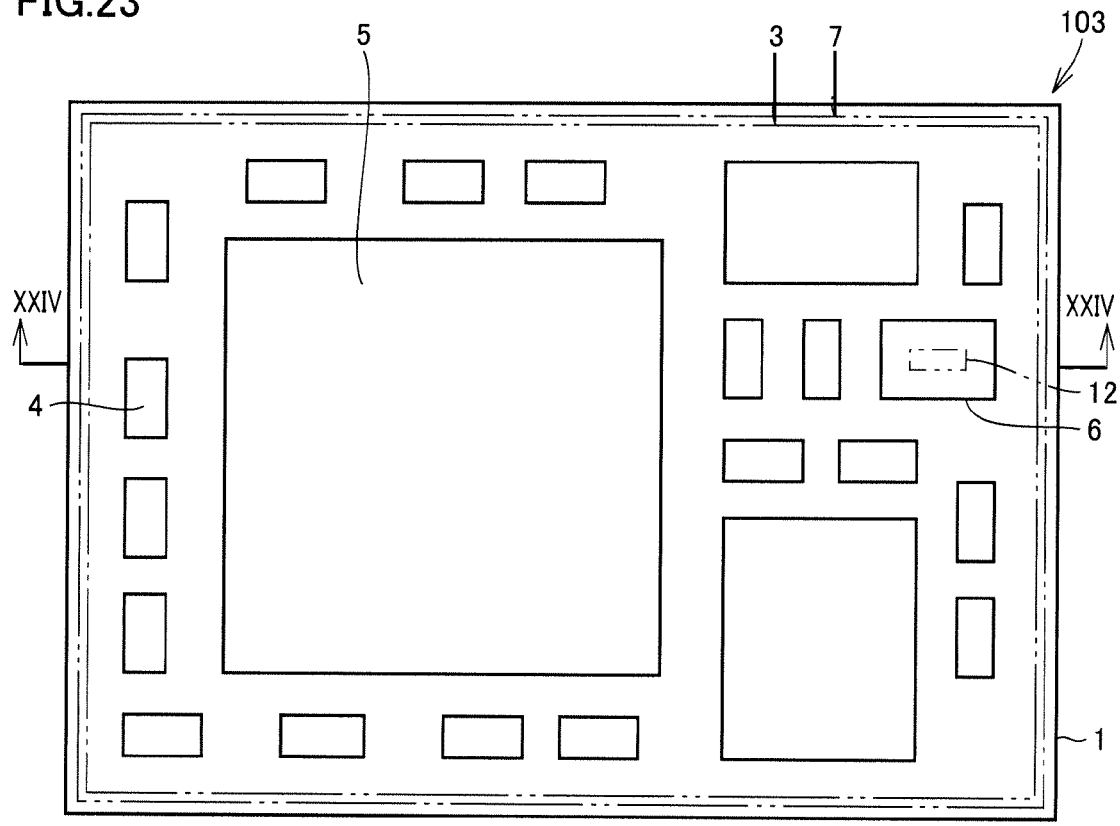
FIG. 23 is a perspective plan view of the circuit module according to the third embodiment based on the present disclosure.
Figure 24:
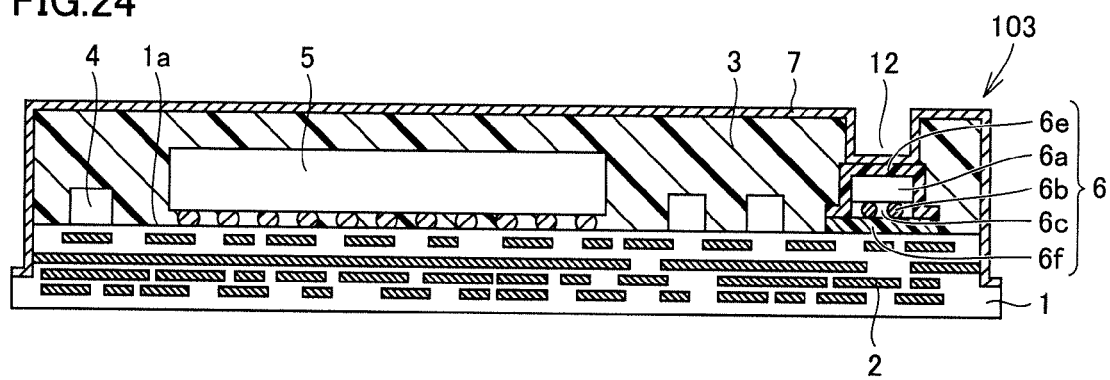
FIG. 24 is a cross-sectional view along line XXIV-XXIV indicated with the arrows in FIG. 23.

Referring to FIGS. 21 to 24, a circuit module according to a third embodiment based on the present disclosure is described. FIG. 21 shows a plan view of the circuit module 103 according to the present embodiment. FIG. 22 shows a side view of the circuit module 103. FIG. 23 shows a perspective plan view of the circuit module 103. FIG. 24 shows a cross-sectional view along line XXIV-XXIV indicated with the arrows in FIG. 23. The basic structure of the circuit module 103 is similar to that of the circuit module 102 described in the second embodiment. The circuit module 103 is different from the circuit module 102 described in the second embodiment on the following points.

In the circuit module 103, no second resin portion 8 is present on a first component 6. The circuit module 103 includes a depressed portion 12 in the upper surface thereof. The depressed portion 12 is provided in the region that corresponds to the upper surface of the first component 6. The upper surface of the first component 6 is lower than the upper surface of a sealing resin portion 3. A conductor film 7 directly covers a resin portion 6e that forms the upper surface of the first component 6.

The present embodiment can also bring advantages such as those described in the first embodiment.

Referring to FIGS. 5, 15, 25 to 29, and 24, a method for manufacturing the circuit module according to the third embodiment based on the present disclosure is described.

First, as illustrated in FIG. 5, a substrate 1 having a principal surface 1a is prepared. As illustrated in FIG. 15, components 4 and 5, and the first component 6 are mounted over the principal surface 1a. Until here, the process remains the same as that described in the second embodiment.

Figure 25:
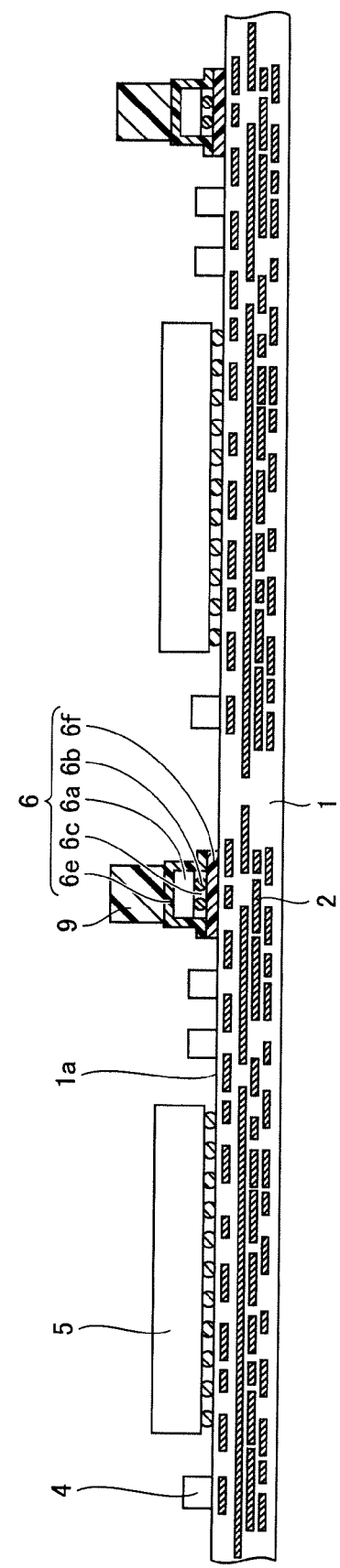
FIG. 25 is a first explanatory diagram for a method for manufacturing the circuit module according to the third embodiment based on the present disclosure.

As illustrated in FIG. 25, potting is performed with resin on the first component 6. Thus, a resin portion 9 is formed on the first component 6. As a material for the resin portion 9, the resin is selected from the one which are not degraded at approximately 150° C. which is a solidification temperature of the resin as the material for the sealing resin portion 3, and can be removed using a liquid etcher. Specifically, butyral resin can be employed for example. Although illustrated as a rectangle in FIG. 25, in actuality, the resin portion 9 is not limited to such a rectangle and has a shape projecting upward because of the coating by the potting. The resin portion 9 may have a domical shape for example.

For example, if the height of the first component 6 is 0.4 mm, the height of the highest component is 0.5 mm, and the thickness of the sealing resin portion 3 on the highest component is 0.1 mm, the resin portion 9 is formed to have a thickness larger than 0.2 mm. For example, the resin portion 9 is formed to have a thickness of 0.3 mm.

Figure 26:
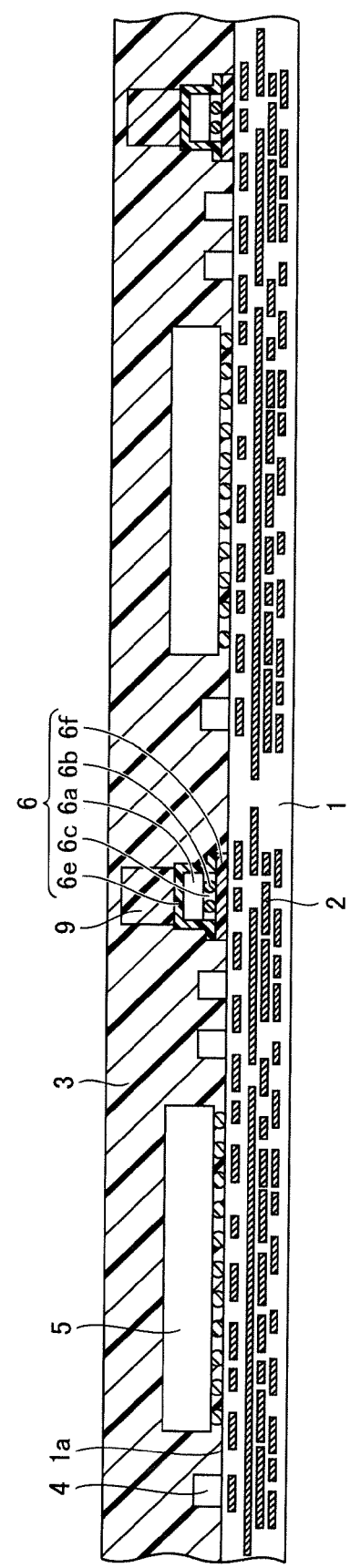
FIG. 26 is a second explanatory diagram for the method for manufacturing the circuit module according to the third embodiment based on the present disclosure.

As illustrated in FIG. 26, the sealing resin portion 3 is formed. The sealing resin portion 3 is formed to cover at least the components 4 and 5, and the first component 6. At this time, the sealing resin portion 3 may also cover the upper surface of the resin portion 9.

Figure 27:
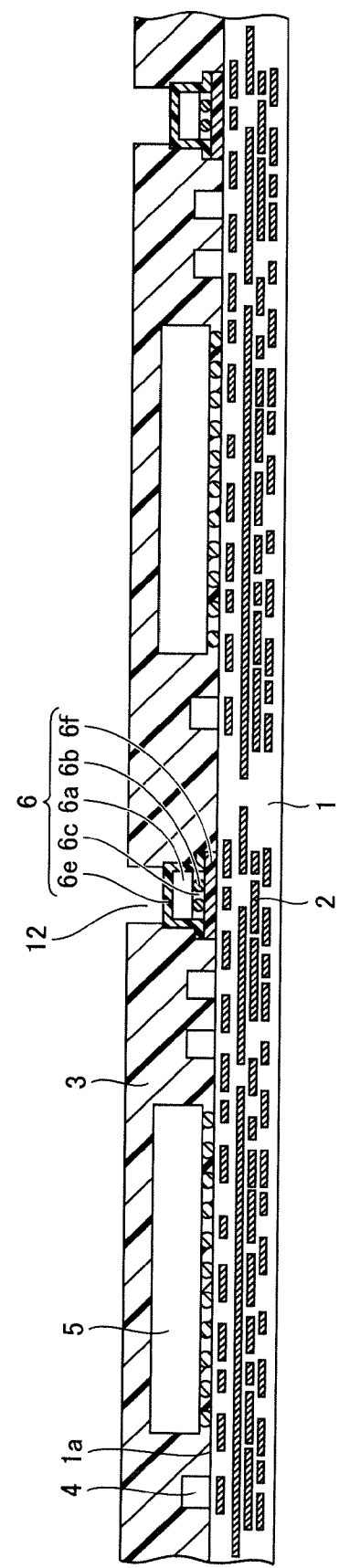
FIG. 27 is a third explanatory diagram for the method for manufacturing the circuit module according to the third embodiment based on the present disclosure.

Grinding is performed on the upper surface of the sealing resin portion 3 so as to expose the resin portion 9. Further, the resin portion 9 is removed by a known technique, such as etching. For example, the resin portion 9 is removed using an etcher, such as alcohol. As a result, as illustrated in FIG. 27, a structure can be obtained, where the depressed portion 12 is present in the region that corresponds to the first component 6. Although the depressed portion 12 is depicted through simplification in the drawings, in actuality, the diameter of the depressed portion 12 may vary between higher and lower levels and the depressed portion 12 may be tapered. For example, the width of the depressed portion 12 may decrease toward a lower level.

Figure 28:
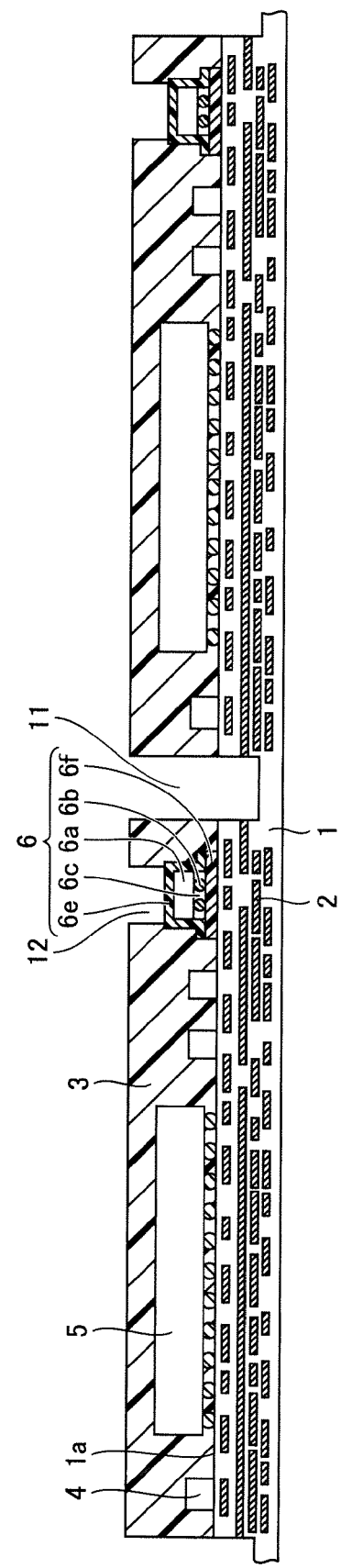
FIG. 28 is a fourth explanatory diagram for the method for manufacturing the circuit module according to the third embodiment based on the present disclosure.

As illustrated in FIG. 28, so-called half-cutting is performed. Thus, a groove 11 is formed.

Figure 29:
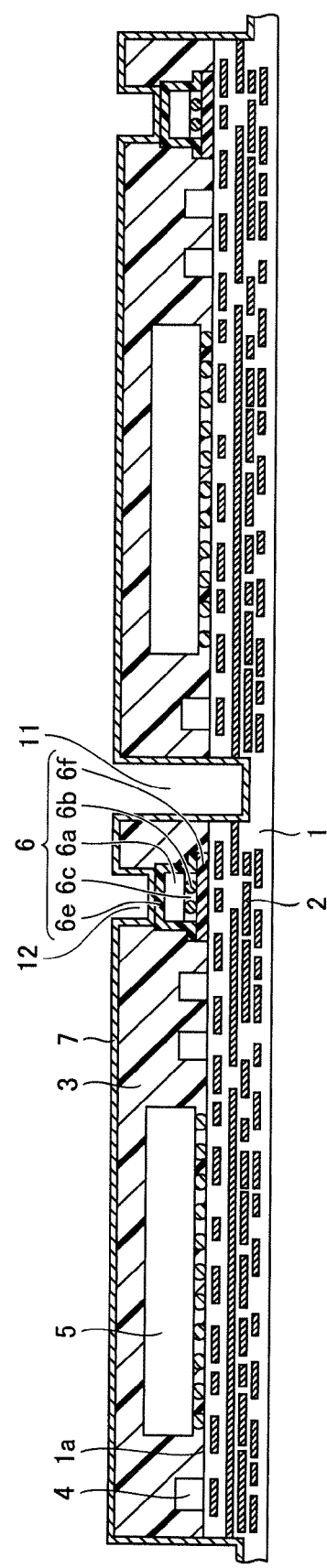
FIG. 29 is a fifth explanatory diagram for the method for manufacturing the circuit module according to the third embodiment based on the present disclosure.

As illustrated in FIG. 29, the conductor film 7 is formed. The conductor film 7 is formed so as to cover the inner surface of the depressed portion 12 and the upper surface of the sealing resin portion 3 collectively. From the state illustrated in FIG. 29, the division is performed to achieve an individual size of the circuit module 103. It is here desired to divide the substrate 1 along the groove 11 already formed. Thus, the circuit module 103 illustrated in FIG. 24 can be obtained.

Two or more of the above-described embodiments may be combined and employed.

The above-described embodiments disclosed herein are examples in every respect and not limiting. The scope of the present disclosure is recited in the claims and the present disclosure includes all modifications within meanings equivalent to the claims and the scope thereof.

1 SUBSTRATE
1a PRINCIPAL SURFACE
2 CONDUCTOR PATTERN
3 SEALING RESIN PORTION
4, 5 COMPONENT
6 FIRST COMPONENT
6a COMPONENT BODY
6b CONNECTION PORTION
6c EMPTY PORTION
6d FIRST RESIN PORTION
6e RESIN PORTION
6f INTERPOSER
7 CONDUCTOR FILM
8 SECOND RESIN PORTION
9 RESIN PORTION (TO BE REMOVED LATER)
11 GROOVE
12 DEPRESSED PORTION
101, 102, 103 CIRCUIT MODULE

The invention claimed is:

1. A circuit module comprising:
a substrate having a principal surface;
a first component mounted on the principal surface; and
a sealing resin portion covering at least a side surface of the first component while covering the principal surface,
the first component including an empty portion and a connection portion exposed to the empty portion,
the sealing resin portion being not arranged on at least a part of a region included in an upper surface of the first component and overlapping with the empty portion when viewed in a plan view; and
the upper surface of the first component is positioned lower than an upper surface of the sealing resin portion.

2. The circuit module according to claim 1, wherein
the first component includes a first resin portion at a higher level than the empty portion, the first resin portion comprising a first resin, and
an upper surface of the first resin portion and an upper surface of the sealing resin portion are in an identical plane.

3. The circuit module according to claim 1, wherein
a second resin portion is arranged over the first component, the second resin portion comprising a second resin having a lower Young's modulus than a material for the sealing resin portion, and an upper surface of the second resin portion and the upper surface of the sealing resin portion are in an identical plane.

4. The circuit module according to claim 1, wherein
a conductor film is arranged to cover at least a boundary between the upper surface of the first component and the upper surface of the sealing resin portion.

5. The circuit module according to claim 3, wherein
a conductor film is arranged to cover at least a boundary between the upper surface of the second resin portion and the upper surface of the sealing resin portion.

6. The circuit module according to claim 2, wherein
a conductor film is arranged to cover at least a boundary between the upper surface of the first component and the upper surface of the sealing resin portion.

* * * * *